United States Patent [19]

Sakoyama et al.

[11] Patent Number: 5,248,935
[45] Date of Patent: Sep. 28, 1993

[54] ELECTRONIC TYPE WATTHOUR METER INCLUDING AUTOMATIC MEASURING-ERROR CORRECTING FUNCTION

[75] Inventors: Mitsuhiro Sakoyama; Masaharu Takeda; Naohide Suzuki, all of Tokyo, Japan

[73] Assignee: Kabushiki Kaisha Toshiba, Tokyo, Japan

[21] Appl. No.: 838,946

[22] Filed: Feb. 21, 1992

[30] Foreign Application Priority Data

May 20, 1991 [JP] Japan .................................. 3-114308
May 28, 1991 [JP] Japan .................................. 3-123860

[51] Int. Cl.$^5$ ........................ G01R 11/32; G06G 7/16
[52] U.S. Cl. ............................... 324/142; 324/103 R; 340/637; 364/483
[58] Field of Search ............... 324/141, 142, 103 R, 324/116, 140 R; 364/483, 481; 340/637, 652, 660

[56] References Cited

U.S. PATENT DOCUMENTS

| | | | |
|---|---|---|---|
| 4,165,485 | 8/1979 | Takahashi | 324/142 |
| 4,224,671 | 9/1980 | Sugiyama et al. | 324/142 |
| 4,534,045 | 8/1985 | Collier | 324/142 |
| 4,920,312 | 4/1990 | Maruyama | 324/142 |

*Primary Examiner*—Vinh Nguyen
*Attorney, Agent, or Firm*—Oblon, Spivak, McClelland, Maier & Neustadt

[57] ABSTRACT

An electronic type watthour measuring apparatus equipped with an automatic measuring-error correcting circuit. The electronic type watthour measuring apparatus includes: a power-to-voltage (W/V) converter for converting electrical power supplied from a power source into a voltage signal corresponding to the electrical power; a voltage-to-frequency converter for converting the voltage signal derived from the W/V-converter into a frequency signal corresponding to the voltage signal and indicative of the electrical power with an error; a calculator for calculating a difference between the frequency of the frequency signal and a frequency of a reference signal derived from a reference watthour meter while measuring the same electrical power from the power source; and a controller for controlling the voltage signal outputted from the W/V-converter based on the difference in the frequencies of both the frequency signal and reference signal so as to eliminate the error contained in the electric power measured by the electronic type watthour measuring apparatus.

5 Claims, 10 Drawing Sheets

ELECTRONIC TYPE WATTHOUR METER INCLUDING AUTOMATIC MEASURING-ERROR CORRECTING FUNCTION

BACKGROUND OF THE INVENTION

1. Field of the Invention

The present invention generally relates to an automatic watthour meter adjusting system. More specifically, the present invention is directed to an electronic type watthour measuring apparatus equipped with an automatic measuring-error correcting circuit, utilized in a watthour meter manufacturing factory, or an end user.

2. Description of the Prior Art

Conventionally, so-called "pulse-count comparison method" has been widely introduced to measure errors occurring in the electronic type watthour meters in the watthour meter manufacturing factories, or the end users. The basic idea of this conventional pulse-count comparison method will now be summarized.

Figure 1:
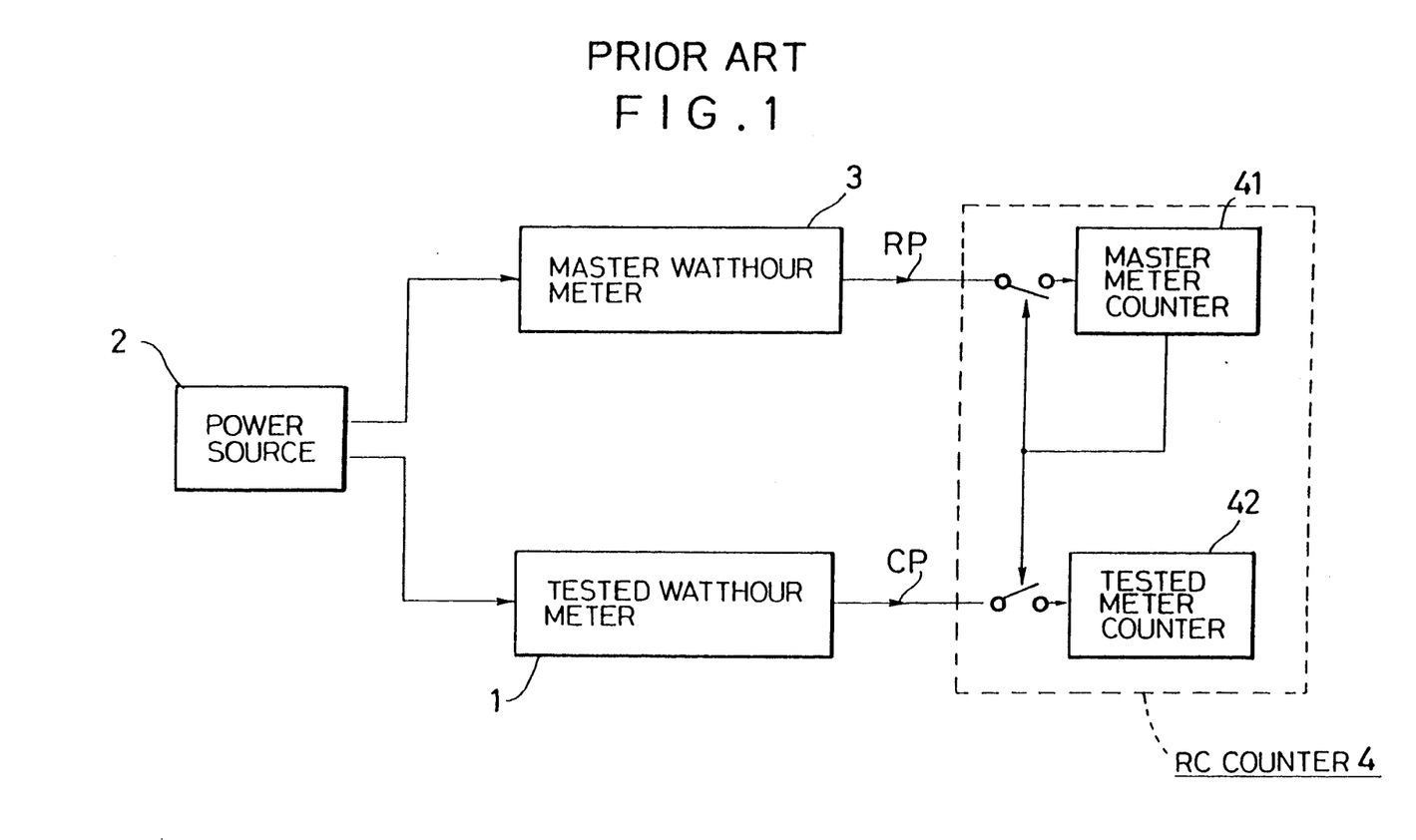
FIG. 1 schematically illustrates the conventional pulse-count comparison method for correcting the measuring error of the tested watthour meter.

As shown in FIG. 1, electrical power generated from a power generating source 3 is supplied not only to a watthour meter 1 which should be tested, but also to a master (reference) watthour meter 3 which has been previously adjusted or calibrated by another standard watthour meter (not shown) with a higher precision, or sensitivity than that of the tested watthour meter 1 as well as the master watthour meter 3. Then, after measuring this electrical power, the tested watthour meter 1 outputs count pulses "CP" in proportional to this measured power, whereas the master watthour meter 2 outputs reference pulses "RP". Both the count pulses "CP" derived from the tested watthour meter 1, and the reference pulses "RP" derived from the master watthour meter 3 are supplied to an RC counter 4. Precisely speaking, these pulses "CP" and "RP" are counted by a counter 41 for the master watthour meter 3, and a counter 42 for the tested watthour meter respectively during a predetermined time period. Accordingly, count values of these master meter counter 41 and tested meter counter 42 are displayed in the RC counter.

Subsequently, an operator manually calculates an error (namely, a measuring error of the meter 1) contained in the count value of the tested watthour meter 1 with respect to the count value of the master watthour meter 2 in accordance with the following formula (1):

$$E(\%) = (CP\ value - Rp\ value) \times 100 / RP\ value \qquad (1).$$

where symbol "E" indicates an error in unit of percent, symbol "CP value" represents the count value of the tested meter counter 42, and symbol "RP value" denotes the count value of the master meter counter 41.

In accordance with such a conventional pulse-count comparison method, there is a merit that although precision of the master watthour meter 3 may cause measurement precision, precision of the power generating source 2 need not be so high, but also high stability thereof is not required, and therefore variations in the electrical power produced from this power generating source 2 are acceptable to some extent.

Figure 2:
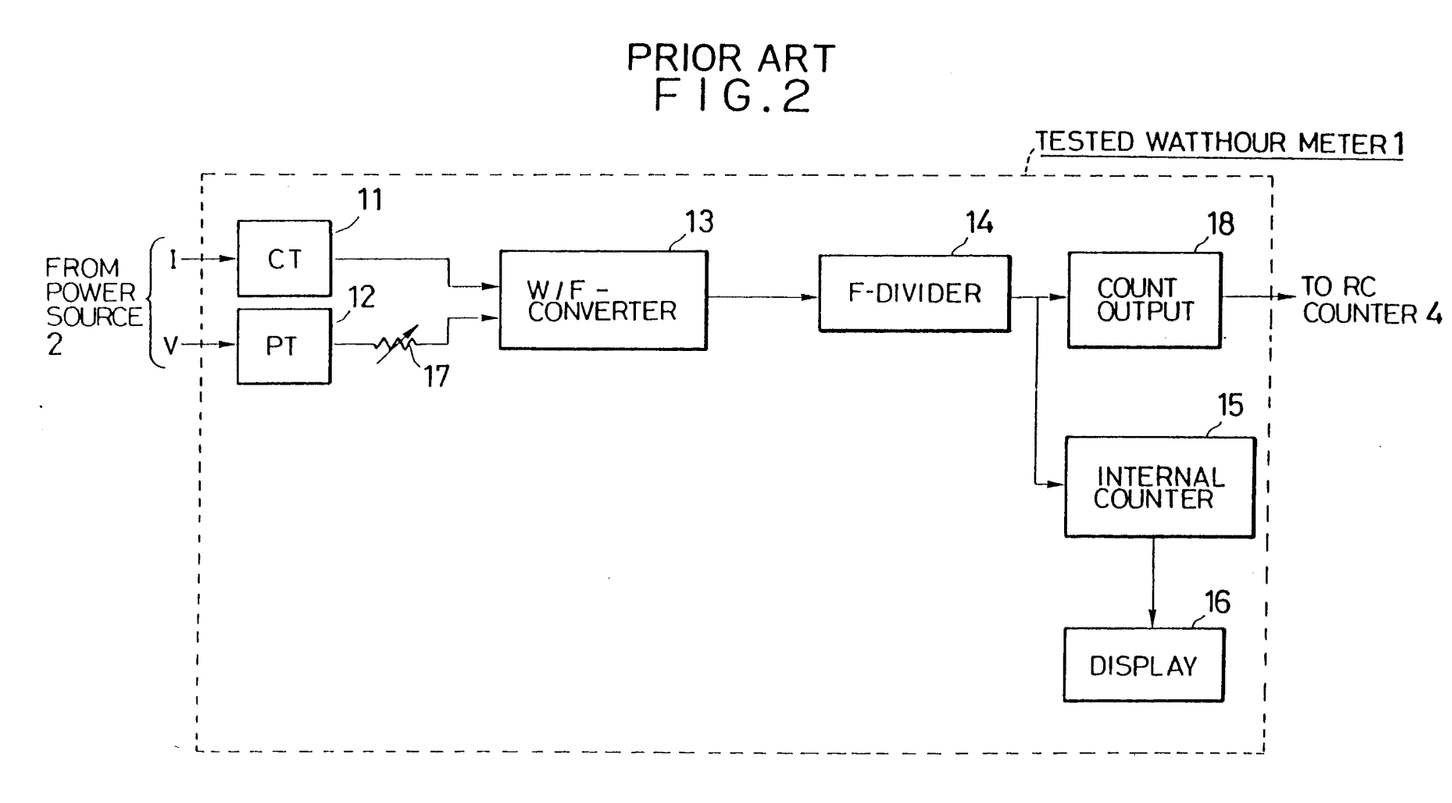
FIG. 2 is a schematic block diagram for showing an internal circuit arrangement of the tested watthour meter shown in FIG. 1.

FIG. 2 represents an internal circuit arrangement of the tested watthour meter 2. In this internal circuit arrangement, both a current component "1" of electric power supplied from the power source 1 and a voltage component "V" thereof are detected by a current transformer (CT) 11 and a potential transformer (PT) 12, respectively, so that both a current signal and a voltage signal are derived from the CT 11 and the PT 12. The current signal derived from the CT 11 is directly supplied to a power/frequency converter 13, whereas the voltage signal derived from the PT 12 is supplied via a variable resistor 17 thereto. Then, the current signal is multiplied with the voltage signal in the power/frequency converter 13, whereby the multiplied value (namely, electrical power) is converted into a pulse signal, whose count value is directly proportional to the multiplied value. The pulse signal is frequency-divided into another pulse signal having such a frequency suitable for the pulse counting operation by a frequency divider 14. The frequency-divided pulse signal is processed in an output unit 18, thereby obtaining a processed pulse signal (namely, the above-described count pulse "CP") which will then be supplied to the RC counter 4 shown in FIG. 4. At the same time, this frequency-divided pulse signal is counted by a test meter counter 15, so that the count value (namely, watthours measured by this tested watthour meter 1) is displayed on a display unit 16.

To perform the adjustment of the tested watthour meter 1 with the above-described circuit arrangement in accordance with the conventional pulse-count comparison method, the following manual error-correcting operation must be carried out by an operator. That is, after the first error measurement (manual error calculation), an error is calculated from the count value corresponding to watthours displayed in the RC counter 4. Based on the last-mentioned error, the variable resistor 17 connected to the output terminal of the potential transformer 12 is manually adjusted so as to reduce this calculated error to be zero. Subsequently, a series of error measuring operation is again performed and a check is made whether or not a present error is involved within an allowable error range. If the present error is deviated from the allowable error range, the above-described error adjustment with controlling of the variable resistor 17 and also the above-explained error measurement are repeatedly performed until the measured error is involved within this allowable error range.

As previously explained in detail, in accordance with such a conventional error correcting method for the tested watthour meter, in order to reduce the error contained in watthours measured by the tested watthour meter 1 to the allowable value, the variable resistor 17 must be manually adjusted by an operator, or a worker in a factory. In other words, such a conventional error correcting operation requires plenty of manual adjustment procedure. As a consequence, a lengthy and cumbersome manual adjustment operation is necessarily needed, resulting in lowering of work efficiencies and expensive adjusting operation.

SUMMARY OF THE INVENTION

The present invention has been made in an attempt to solve the above-described costly and cumbersome error correcting problems, and therefore has an object to provide an electronic type watthour measuring apparatus equipped with an automatic measuring-error correcting function.

Another object of the present invention is to provide an electronic type watthour measuring apparatus capable of automatically correcting such a measuring error within a short time.

A further object of the present invention is to provide an electronic type watthour measuring apparatus capable of automatically correcting such a measuring error in high precision.

To achieve these objects and other features, an electronic type watthour measuring apparatus, according to the present invention, comprises:

power-to-voltage (W/V) converting means (53) for converting electrical power supplied from a power source (2) into a voltage signal corresponding to the electrical power;

voltage-to-frequency (V/F) converting means (55) for converting the voltage signal derived from the W/V-converting means (53) into a frequency signal ($F_T$) corresponding to the voltage signal and indicative of the electrical power with an error;

means (56) for calculating a difference between the frequency of the frequency signal (FT) and a frequency of a reference signal ($F_R$) derived from a reference watthour meter (3) while measuring the same electrical power from the power source (2); and, means (58:54) for controlling the voltage signal outputted form the W/V-converting means (53) based on the difference in the frequencies of both the frequency signal and the reference signal ($F_R$) so as to eliminate the error contained in the electric power measured by the electronic type watthour measuring apparatus (100).

Furthermore, according to another aspect of the present invention, an electronic type watthour measuring apparatus (200) comprises:

power-to-frequency (W/F) converting means (253) for converting electrical power supplied from a power source (2) into a first frequency signal ($F_T$) having a first frequency and a measuring error, corresponding to the electrical power;

frequency dividing means (255) for dividing the first frequency of the frequency signal ($F_T$) to obtain a second frequency signal having a second frequency lower than the first frequency of the first frequency signal ($F_T$);

means (56) for calculating a difference between the first frequency of the first frequency signal ($F_T$) and a reference frequency contained in a reference signal ($F_R$) derived from a reference watthour meter (3) while measuring the same electrical power from the power source (2);

means (257) for producing a correction coefficient ($C_C$) based upon the difference between the first frequency signal ($F_T$) and the reference frequency signal ($F_R$); and, correcting means (261) for correcting the measuring error contained in the first frequency signal ($F_T$) by processing the second frequency signal in accordance with the correction coefficient ($C_C$) in order to eliminate the measuring error contained in the first reference signal ($F_T$).

As a still further aspect of the present invention, an electronic type watthour measuring apparatus (300) comprises:

power-to-frequency (W/F) converting means (253) for converting electrical power supplied from a power source (2) into a first frequency signal ($F_T$) having a first frequency and a measuring error, corresponding to the electrical power;

frequency dividing means (367) for dividing the first frequency of the first frequency signal ($F_T$) to obtain a second frequency signal having a second frequency lower than the first frequency of the first frequency signal ($F_T$);

means (356) for calculating a difference between the first frequency of the first frequency signal ($F_T$) and a reference frequency contained in a reference signal ($F_R$) derived from a reference watthour meter (3) while measuring the same electrical power from the power source (2); and, means (363) for setting a dividing rate used to the frequency dividing means (367) in accordance with the difference between the first frequency and the reference frequency, whereby frequency-dividing operation by the frequency dividing means (367) is controlled based on the dividing rate set by the setting means (363) so as to eliminate the measuring error contained in the electrical power measured by the electronic type watthour measuring apparatus (300).

BRIEF DESCRIPTION OF THE DRAWINGS

The above-described purposes, and other useful as well as novel features of the present invention will become more readily apparent from the following descriptions considered in conjunction with the accompanying drawings, in which.

DETAILED DESCRIPTION OF THE PREFERRED EMBODIMENTS

Basic Ideas

Before describing various preferred embodiments, basic ideas of the present invention will now be summarized.

In accordance with a first basic idea of the present invention, electrical power produced from a power source is first converted into a corresponding voltage by a power/voltage converter, and thereafter this voltage component is secondly converted into a corresponding frequency component by a voltage/frequency converter. These converters are employed in a tested watthour meter. On the other hand, the electrical power derived from the power source is also supplied to a reference watthour meter which will then output a reference frequency component. Subsequently, the first frequency component derived from the tested watthour meter is compared with the second frequency component derived from the reference watthour meter to obtain a difference value. Based on this difference value, the voltage (i.e., containing a power measuring error) derived from the power/voltage converter employed in the tested watthour meter is automatically adjusted so as to reduce this power measuring error of the tested watthour meter to an allowable range.

Furthermore, in accordance with a second basic idea of the present invention, electrical power generated from a power source is similarly converted into a corresponding frequency component by a power/frequency converter employed in a tested watthour meter. On the other hand, the electrical power of the power source similarly is supplied to a reference watthour meter which will then output a reference frequency components. Thereafter, the first frequency component derived from the tested watthour meter is similarly compared with the second frequency component derived from the reference watthour meter to obtain a difference value. Based upon this difference value, counting operation by a power pulse counter employed in the tested watthour meter is automatically corrected.

Moreover, as a modified second basic idea of the present invention, a frequency dividing ratio of a frequency divider employed in the tested watthour meter is automatically corrected based upon the difference value between the first and second frequency components.

OVERALL ARRANGEMENT OF FIRST WATTHOUR METER WITH AUTOMATIC ERROR CORRECTION

Figure 3:
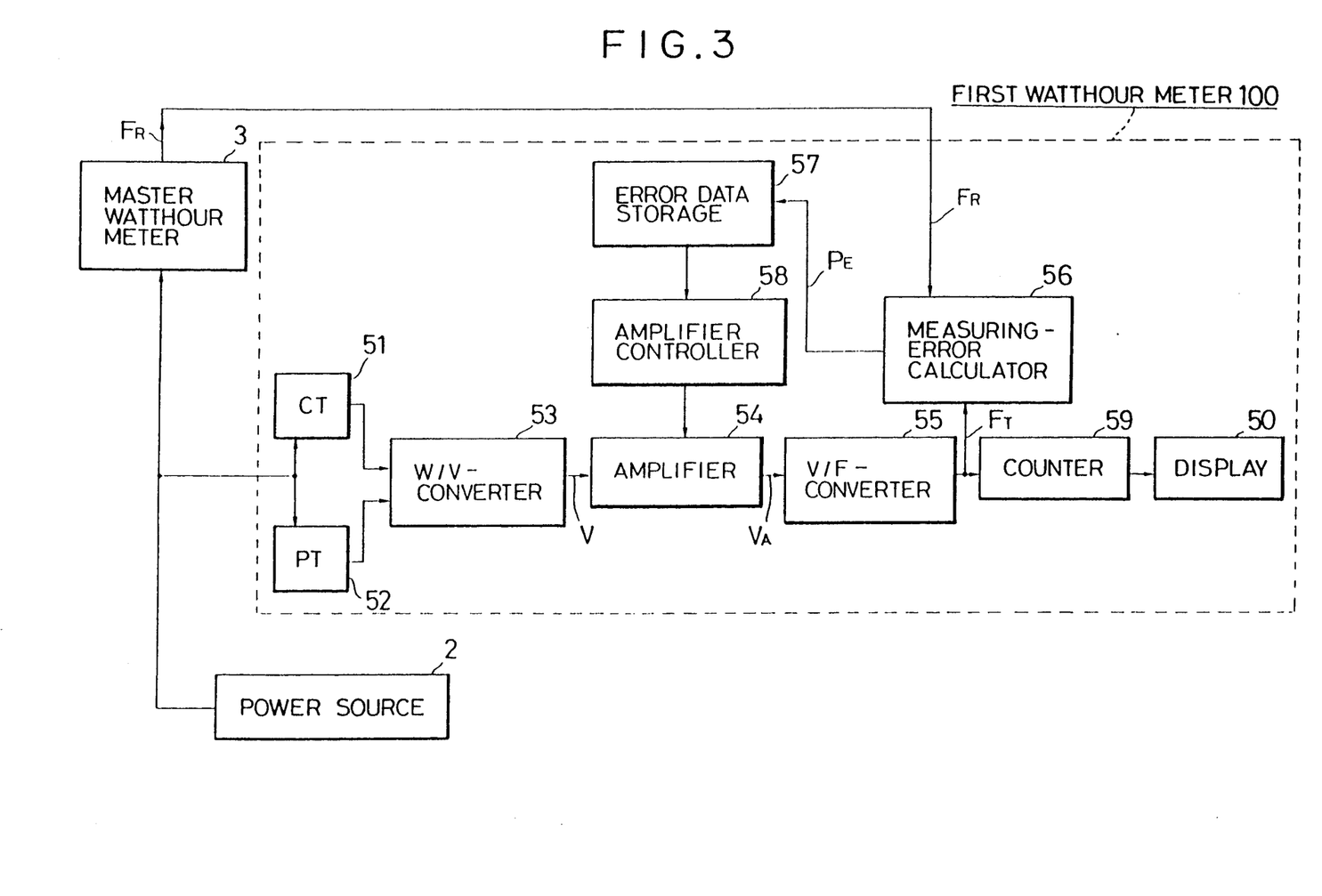
FIG. 3 is a schematic block diagram for showing an overall circuit arrangement of an electronic type watthour measuring apparatus 100 according to a first preferred embodiment of the present invention.

In FIG. 3, there is shown an overall arrangement of an electronic type watthour measuring apparatus 100 with an automatic error correcting function, according to a first preferred embodiment of the present invention. This first electronic type watthour measuring apparatus 100 has been made based on the above-described first basic idea.

As apparent from FIG. 3, the first electronic type watthour measuring apparatus 100 is connected to the master watthour meter 3 and the power source 2 in a similar manner to the arrangement shown in FIG. 1. Accordingly, the measuring precision of the master watthour meter 3 has been previously adjusted by utilizing a high-precision watthour measuring apparatus (not shown), and also the power source 2 does not require high stabilities.

In the first electronic type watthour measuring apparatus 100 corresponding to the tested watthour meter 1 shown in FIG. 1, the electrical power derived from the power source 2 is supplied to both a current transformer (CT) 51 and a potential transformer (PT) 52, so that a current signal proportional to a current component contained in this electrical power is obtained from the CT 51, whereas a voltage signal proportional to a voltage component contained in this electrical power is produced from the PT 52. Both of the current signal and the voltage signal are then converted by a power/voltage (W/V) converter 53 into a converted voltage signal "V".

In this power/voltage converter 53, the current signal is multiplied with the voltage signal, thereby outputting the converted voltage signal "V". The converted voltage signal "V" is amplified by an amplifier 54 to output an amplified voltage signal "$V_A$" which will then be supplied to a voltage/frequency (V/F) converter 55. In the voltage/frequency converter 55, the amplified voltage signal "$V_A$" is converted into a pulse signal having a pulse number corresponding to this amplified voltage signal "$V_1$". This pulse signal is supplied as a power measuring pulse (frequency component) signal "$F_T$" to a calculating unit 56 for a power measuring error and a counter 59. The counter 59 counts this power measuring pulse signal "$F_T$" derived from the voltage/frequency converter 55 to produce a count value which will then be displayed as a watthour on a display unit 50.

On the other hand, the master watthour meter 3 measures the electrical power supplied from the power source 2 and converts this electrical power into a reference pulse signal "$F_R$" having a pulse number proportional to this electrical power. Then, this reference pulse (frequency component) signal "$F_R$" is supplied to the measuring-error calculating unit 56 employed in the first tested watthour meter (namely, first electronic type watthour measuring apparatus 100).

In the measuring-error calculating unit 56, the power measuring pulse signal "$F_T$" supplied from the V/F converter 55 employed in the first tested watthour meter 100 is compared with the reference pulse signal "$F_R$" derived from the master watthour meter 3, so that a difference between these pulse signals "$F_T$" and "$F_R$" is calculated. That is to say, a calculation is made of a power measuring error "$P_E$" between the power measuring pulse signal "$F_T$" representative of watthours measured by the first tested watthour meter 100, and the reference pulse signal "$F_R$" indicative of watthours measured by the master watthour meter 3. This measuring-error calculation is automatically carried out in accordance with the above-described formula (1). In other words, the measuring-error calculating unit 56 according to the first preferred embodiment automatically calculates a difference value between the frequency component contained in the power measuring pulse signal "$F_T$" and the frequency component contained in the reference pulse signal, as previously described in the first basic idea of the present invention.

The power measuring-error data "$P_E$" is furnished to an error data storage unit 57 so as to be stored therein. The power measuring-error data "$P_E$" is read out from this error data storage unit 57 and then supplied to an amplifier controlling unit 58. As a result, in response to the power measuring-error data, an amplification of the above-described amplifier 54 is controlled in such a manner that the power measuring pulse signal "$F_T$" derived from the V/F converter 55 becomes equal to the reference pulse signal "$F_R$ outputted from the master watthour meter 3. This implies that watthours measured by the first tested watthour meter 100 can be equal to reference watthours measured by the master watthour meter 3, or there is no difference between the power measuring pulse signal "$F_T$" and the reference pulse signal "$F_R$".

As a consequence, since the present power measuring pulse signal "$F_T$" derived from the V/F converter 55 no longer contains such a measuring error, a pulse signal indicative of watthours measured by the first watthour meter 100, which become equal to reference watthours measured by the master meter 3, is newly counted by the counter 59, whereby the correctly adjusted watthours (namely free from the measuring error) are finally displayed on the display unit 50.

MAJOR CIRCUIT ARRANGEMENT OF FIRST WATTHOUR METER

Figure 4:
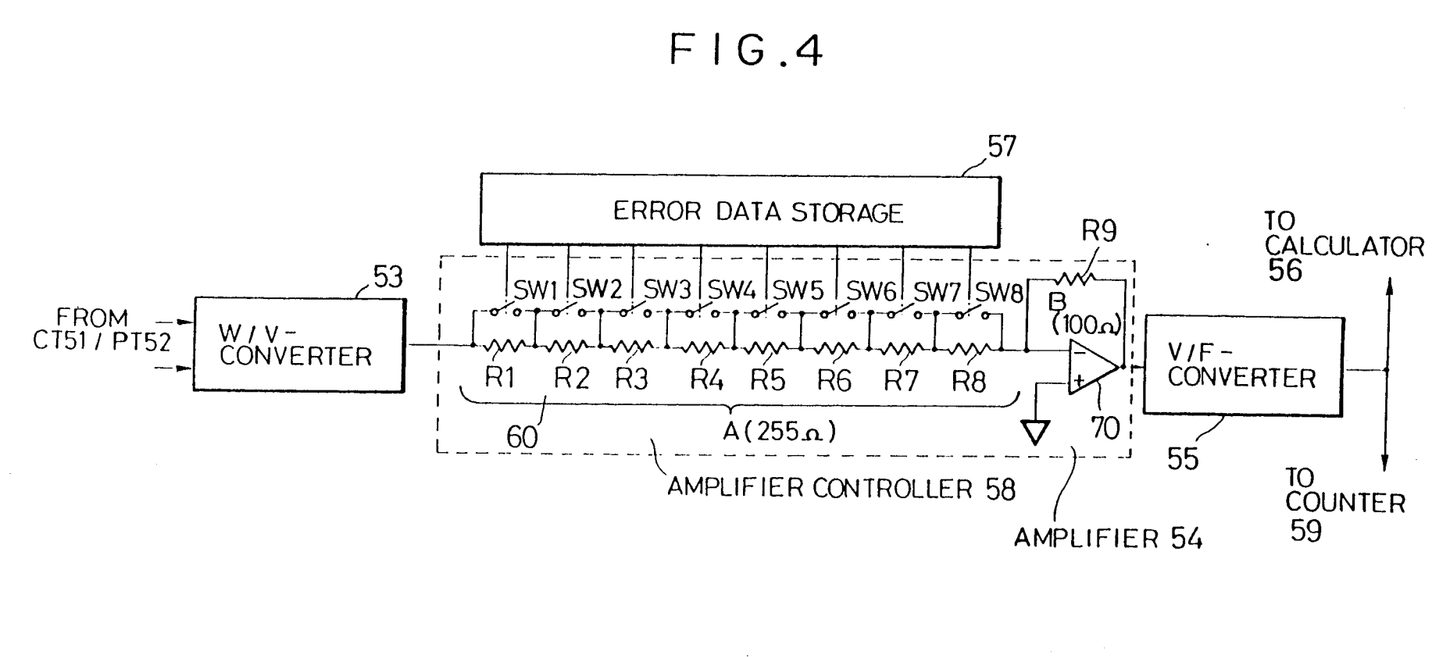
FIG. 4 is internal circuit diagrams of the amplifier controller 58 and the amplifier 54 employed in the first electronic type watthour measuring apparatus 100 shown in FIG. 3.
Figure 5:
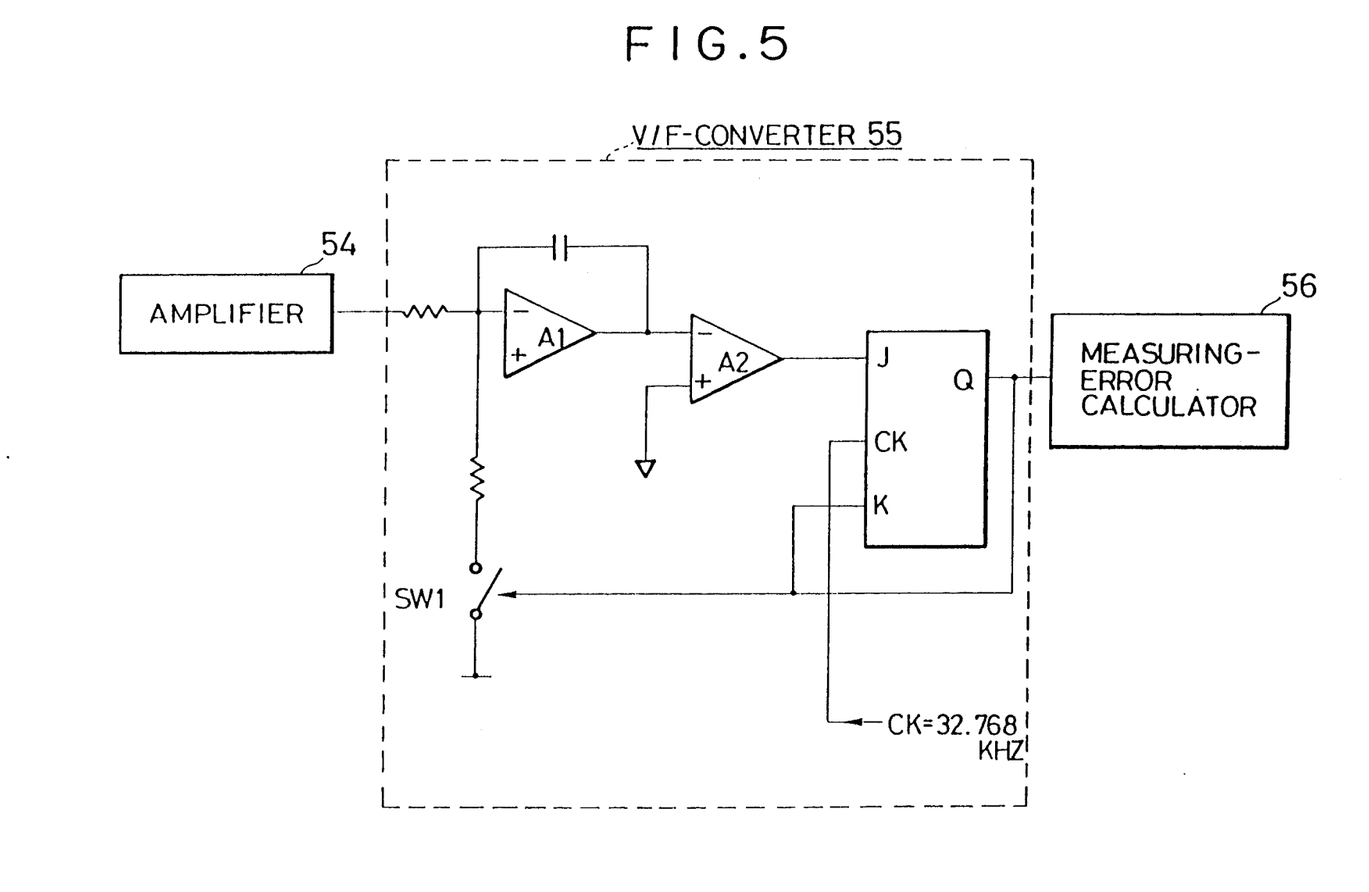
FIG. 5 is an internal circuit diagram of the V/F-convert 55 employed in the first electronic type watthour measuring apparatus 100 shown in FIG. 3.
Figure 6:
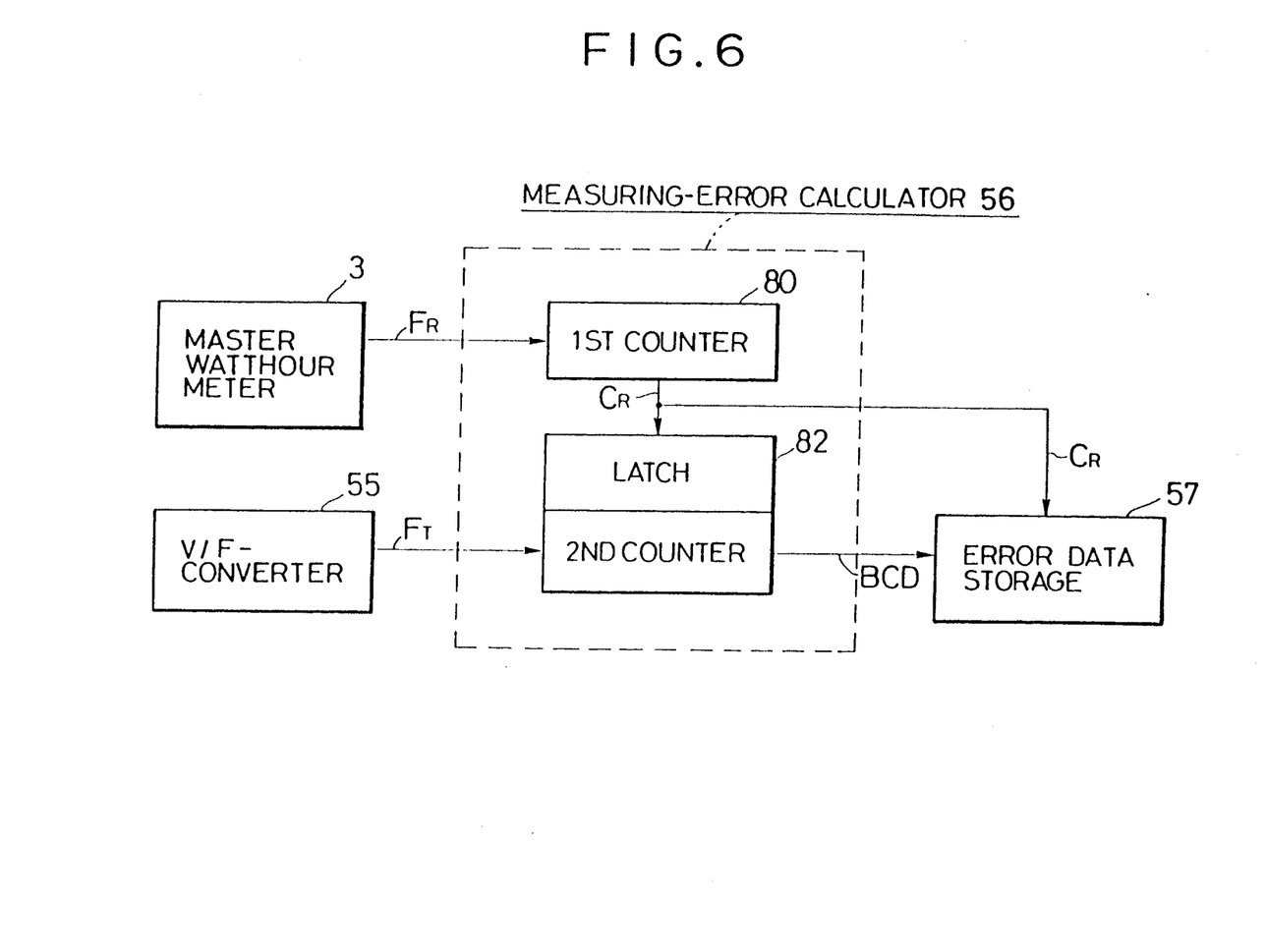
FIG. 6 is an internal circuit diagram of the measuring-error calculating unit 56 employed in the first electronic type watthour measuring apparatus 100 shown in FIG. 3.

FIGS. 4 to 6 represent an internal circuit arrangement of a major featured circuit arrangement in the first electronic type watthour measuring apparatus 100. That is, FIG. 4 shows internal circuit arrangements of the amplifier controlling unit 58 and the amplifier 54; FIG. 5 shows an internal circuit arrangement of the V/F converter 55; and also FIG. 6 indicates an internal circuit arrangement of the measuring-error calculating unit 56, which constitute the featured arrangement of the first electronic type watthour measuring apparatus 100 shown in FIG. 3.

A detailed internal arrangement and also a detailed function of the major circuit will now be described.

In FIG. 4, the amplifier controller 58 is constructed of a ladder resistor 60 and eight switches "SW1" to "SW8". This ladder resistor 60 includes a series circuit of 8 resistor elements "R1" to "R8" having resistance values of 1, 2, 4, 8, 16, 32, 64, and 128 ohms, respectively. The eight switches "SW1" to "SW8" are connected parallel to these resistor "R1" to "R8" as represented in FIG. 4.

The ladder resistor 60 is connected to an inverting input of an operational amplifier 70. One resistor element "R9" having a resistance value of 100 ohms is bridged between this inverting input and an output of the operational amplifier 70. The operational amplifier 70 with the feedback resistor element "R9" constitute the above-described amplifier 54.

In such a circuit arrangement shown in FIG. 4, the voltage which is derived from the W/V-converter 53 and proportional to the output power, is amplified in the amplifier 54 at an amplification that is defined by a ratio of a resistance value "A" (for instance, $1+2+4+8+16+32+64+128=255$ ohms) to a resistance value "B" (100 ohms), namely $B/A=100/255$. Then, the amplified voltage is outputted from the amplifier 54 and applied to the V/F converter 55.

A total effective resistance value "A" of the ladder resistor 60 is determined by the BCD code supplied from the error data storage unit 57 by turning ON/OFF the eight switches "SW1" to "SW8". It should be noted that these resistor element selecting switches "SW1" to "SW8" may be formed by analogue switches.

Precisely speaking, in order to cancel the measuring error of the first tested watthour meter 100, the error data storage unit 57 stores data constructed of such a BCD code. Assuming now that this BCD-coded data stored in the error data storage unit 57 is expressed by "11111010", only the switches SW1, SW2, SW3, SW4, SW5, and SW7 are opened so that the respective resistance values of 1, 2, 4, 8, 16 and 64 ohms are series-connected to each other in this ladder resistor 60, resulting in 95 ohms as the resistance value "A". Accordingly, the ratio of A to B is determined as $100/95=1.05$. The resultant amplification of the amplifier 64 is selected to be 1.05, whereby such a measuring error of 5% can be canceled in accordance with the first preferred embodiment.

The internal circuit arrangement of the V/F-converter 55 shown in FIG. 5 is constructed of the known voltage-to-frequency converter as described in Japanese patent amplification No. 63-22032.

Finally, the measuring-error calculating unit 56 is mainly constructed of a first counter 80 and a second counter 82 with a latching function.

In response to the reference pulse signal "$F_R$" proportional to the reference power measured by the master watthour meter 3, the first counter 80 starts to count the reference pulse signal "$F_R$". When the count value of the first counter 80 reaches a predetermined count value, a carry signal "$C_R$" is sent from this counter 80 to the second counter 82 with the latch function. It should be noted that the first counter 80 is of a presettable type counter, to which a predetermined count value is presettable.

On the other hand, the power measuring pulse signal "$F_T$" derived from the V/F converter 55 is counted by the second counter 82, the count value of which is latched in response to the above-described carry signal "$C_R$" supplied from the first counter 80.

The second counter 82 converts the count value latched thereby into corresponding BCD-coded data. The BCD-coded data is stored in the error data storage unit 57 upon receipt of the carry signal as a trigger signal.

It should be noted that this error data storage unit 57 may be formed by a non-volatile memory, or the like, for example EEPROM.

As previously described in detail, in accordance with the first electronic type watthour measuring apparatus 100, the power measuring error contained in the electrical power (i.e., the pulse signal "$F_T$" from the V/F converter 53) measured by this first watthour measuring apparatus 100 is firstly detected in comparison with the reference power measuring value. Subsequently, the amplification of the amplifier 54 is automatically controlled based on this measuring error in such a manner that this measuring error can be canceled, or reduced to an allowable small value. Such a measuring-error correcting operation of the first watthour meter 100 is automatically performed. As a result, the conventional complicated and manual error correcting operation can be avoided, and therefore both the meter adjusting cost and meter adjusting time can be considerably reduced. Moreover, careless mistakes made by workers in factories can be prevented, while adjusting or canceling the measuring errors.

OVERALL ARRANGEMENT OF SECOND WATTHOUR METER

Figure 7:
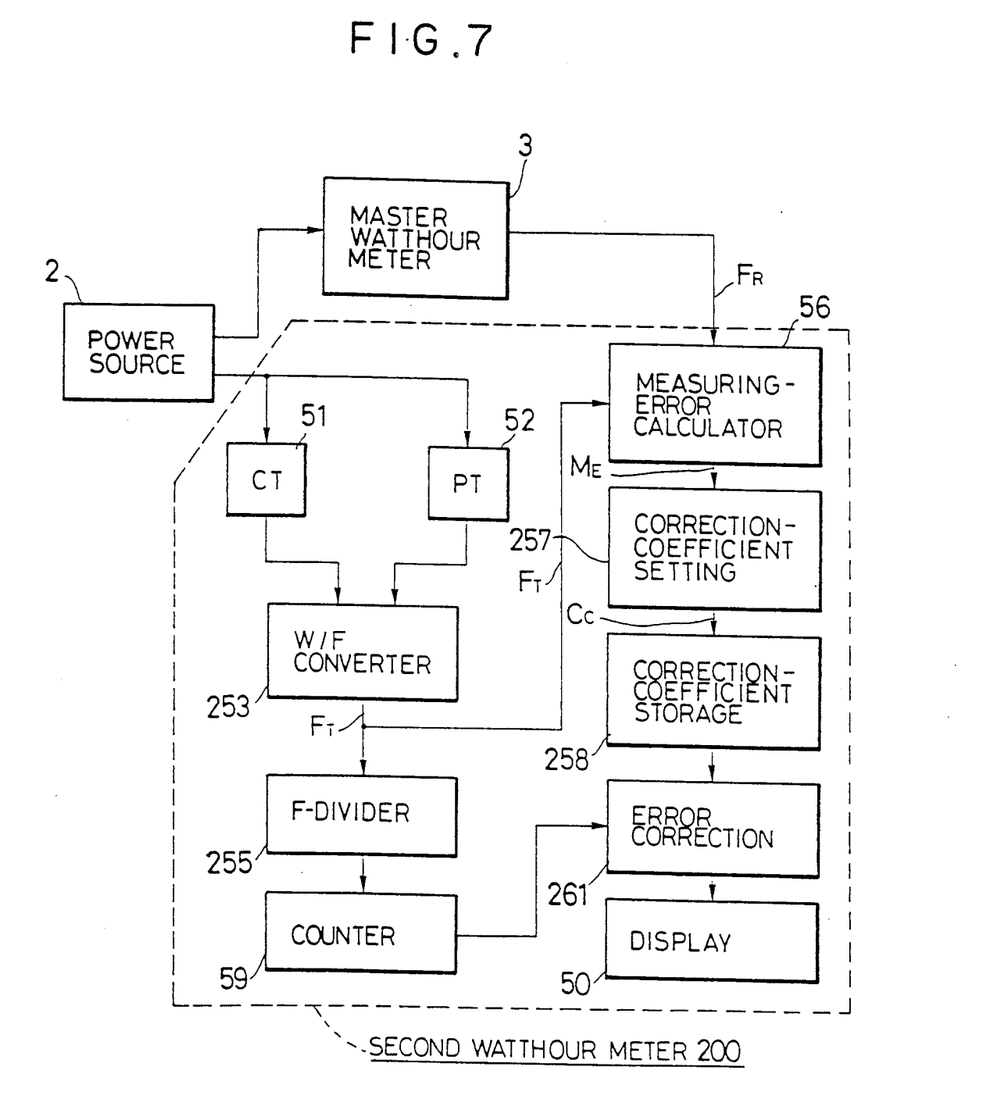
FIG. 7 is a schematic block diagram for representing an overall arrangement of an electronic type watthour measuring apparatus 200 according to a second preferred embodiment of the present invention.

Referring now to FIG. 7, an entire arrangement of an electronic type watthour measuring apparatus 200 according to a second preferred embodiment of the present invention will be described, which has been accomplished based on the second basic idea.

Since a major circuit arrangement of the second watthour measuring apparatus 200 shown in FIG. 7 is similar to that of the first watthour measuring apparatus 100 shown in FIG. 3, only a featured circuit arrangement belonging to this second watthour measuring apparatus 200 will now be explained in the following description.

In the second watthour meter 200, the frequency (component) signal "$F_T$" derived from a W/F (power-to-frequency) converter 253 is supplied to a frequency divider 255 and also to the measuring-error calculating unit 56. The frequency divider 255 subdivides this frequency signal "$F_T$" into another frequency signal having a lower frequency than that of the first-mentioned frequency signal "$F_T$", which is suitable to be counted in the counter unit 59. This counter unit 59 counts the subdivided frequency signals supplied from the frequency divider 255, and outputs a count value via a correcting circuit 261 to the display unit 50, whereby the power containing the measuring-error presently measured by the second watthour meter 200 is displayed on the display unit 50 (will be described more in detail).

Similar to the measuring-error calculation in the first watthour meter 100, the frequency signal "$F_T$" derived from the W/F converter 253 is compared with the reference frequency signal "$F_R$" produced from the master watthour meter 3 so as to calculate the power measuring-error involved in the second watthour meter 200 whose automatic error correcting function is not yet effective. In other words, a power measuring error is calculated between the reference pulse signal ($F_R$) indicative of watthours presently measured by the master watthour meter 3, and also the measuring pulse signal ($F_T$) representative of watthours presently measured by the second watthour meter 200, resulting in a measuring-error signal "$M_E$". Subsequently, this measuring-error signal "$M_E$" is supplied to a correction-coefficient setting unit 257. In this correction-coefficient setting unit 257, such a correction coefficient "$C_C$" is set that the above-defined power measuring-error can be canceled, or reduced to zero. Then, this correction coefficient "$C_C$" is stored in a correction-coefficient storage unit 258. It should be noted that since this correction-coefficient storage unit 258 may be constructed of a non-volatile memory device such as EEPROM, this correction-coefficient "$C_C$" is not electrically erased even when a power down condition happens to occur.

From the correction-coefficient storage unit 258, the correction-coefficient "$C_C$" is supplied to a measuring-error correcting unit 261, while the above-described count value of the present power measured by the second watthour meter 200 is also supplied thereto. As a result, this count value containing such a measuring-error is multiplied with the correction coefficient "$C_C$", so that the measuring error can be automatically corrected in this measuring-error correcting unit 261. Thus, watthours which have been automatically corrected are displayed on the display unit 50 in accordance with the second watthour meter 200.

It should also be noted that since a first correction coefficient of "1.00" has been set by the correction-coefficient setting unit 257 into the correction-coefficient storage unit 258, no error correction is executed at the first power measuring stage by the second watthour meter 200 shown in FIG. 7.

INTERNAL CIRCUIT ARRANGEMENT OF MAJOR ARRANGEMENT IN SECOND WATTHOUR METER

Figure 8:
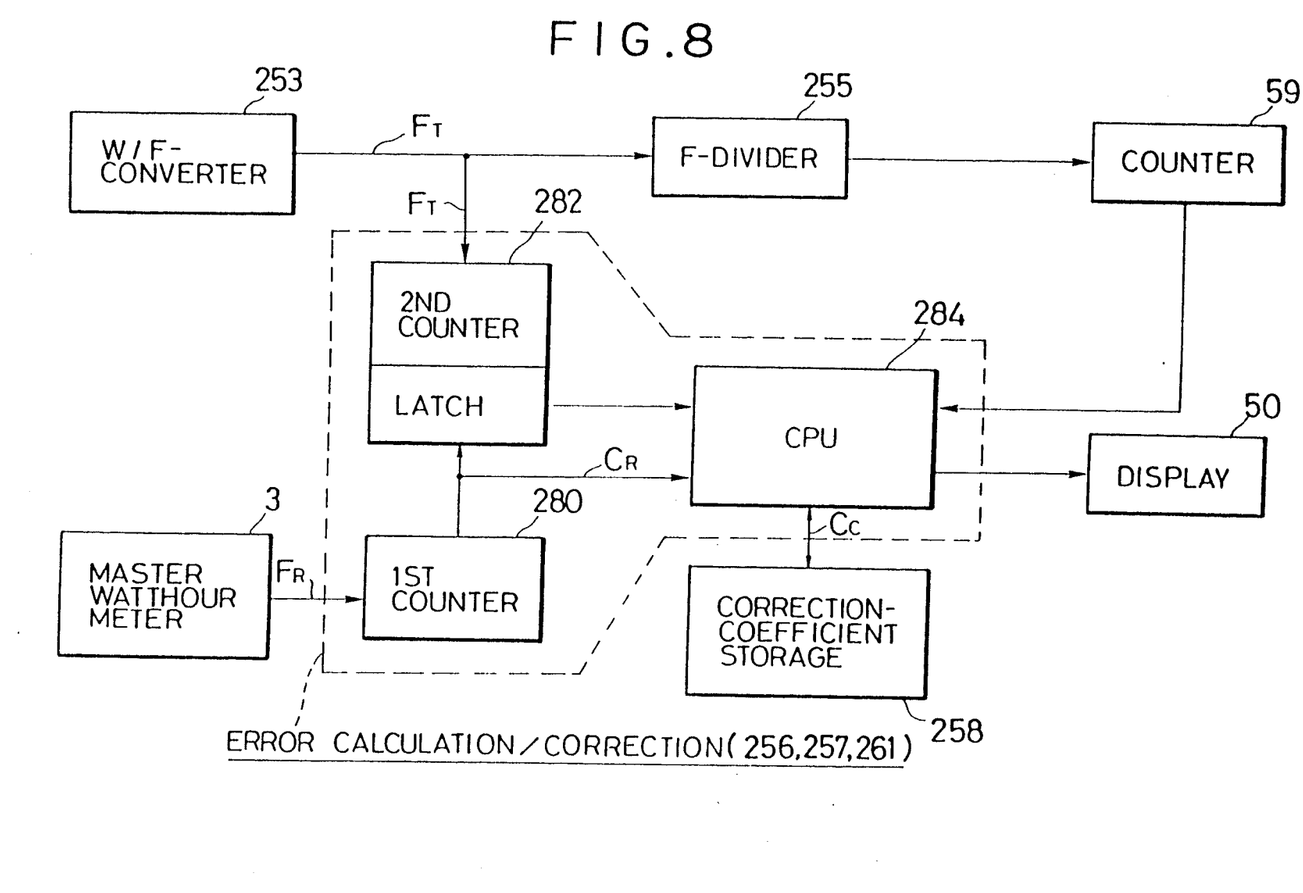
FIG. 8 is a schematic block diagram for showing an internal circuit of the major arrangement employed in the second watthour meter 200 shown in FIG. 7.

FIG. 8 represents an internal circuit arrangement of the major arrangement employed in the second watthour meter 200 shown in FIG. 7, namely, the measuring-error calculating unit 256, correction-coefficient setting unit 257 and error correcting unit 261.

In this internal circuit arrangement, the reference power pulse signal "$F_R$" containing the reference frequency component is counted by a first counter 280 employed in the measuring-error calculating unit 256. When the count value of this first counter 280 reaches a preselected count value and then delivers a carry signal "$C_R$" to both a second counter 282 with a latch function and also a central processing unit 284. Note that the first counter 280 is of a presettable counter, into which a predetermined count value can be preset.

On the other hand, the above-described power measuring pulse signal "$F_T$" is supplied from the W/F-counter 53 to the second counter 282 with the latch function, and another count value counted by the second counter 282 is latched in response to the carry signal "$C_R$" derived from the first counter 280.

Then, this count value latched in the second counter 282 is fetched into CPU 284 in response to the carry signal "$C_C$" as a trigger signal. A measuring-error calculation as defined above will now be executed under control of CPU 284, and furthermore the correcting-coefficient "$C_C$" is calculated under control of CPU 284. The resultant correcting-coefficient "$C_C$" is supplied to the correction-coefficient storage unit 258 to be stored therein. Subsequently, the count value from the counter unit 59 is multiplied by the correction-coefficient read out from the correction-coefficient storage unit 238 under control of CPU 284.

Finally, the count value from the counter unit 59 can be corrected in this manner and the resultant count value is supplied to the display unit 50.

Accordingly, the power measuring pulse signal "$F_T$" is fetched and automatically error-corrected based on this correction-coefficient "$C_C$" under control of CPU 284 in accordance with the second watthour meter 200.

OVERALL ARRANGEMENT OF THIRD WATTHOUR METER

Figure 9:
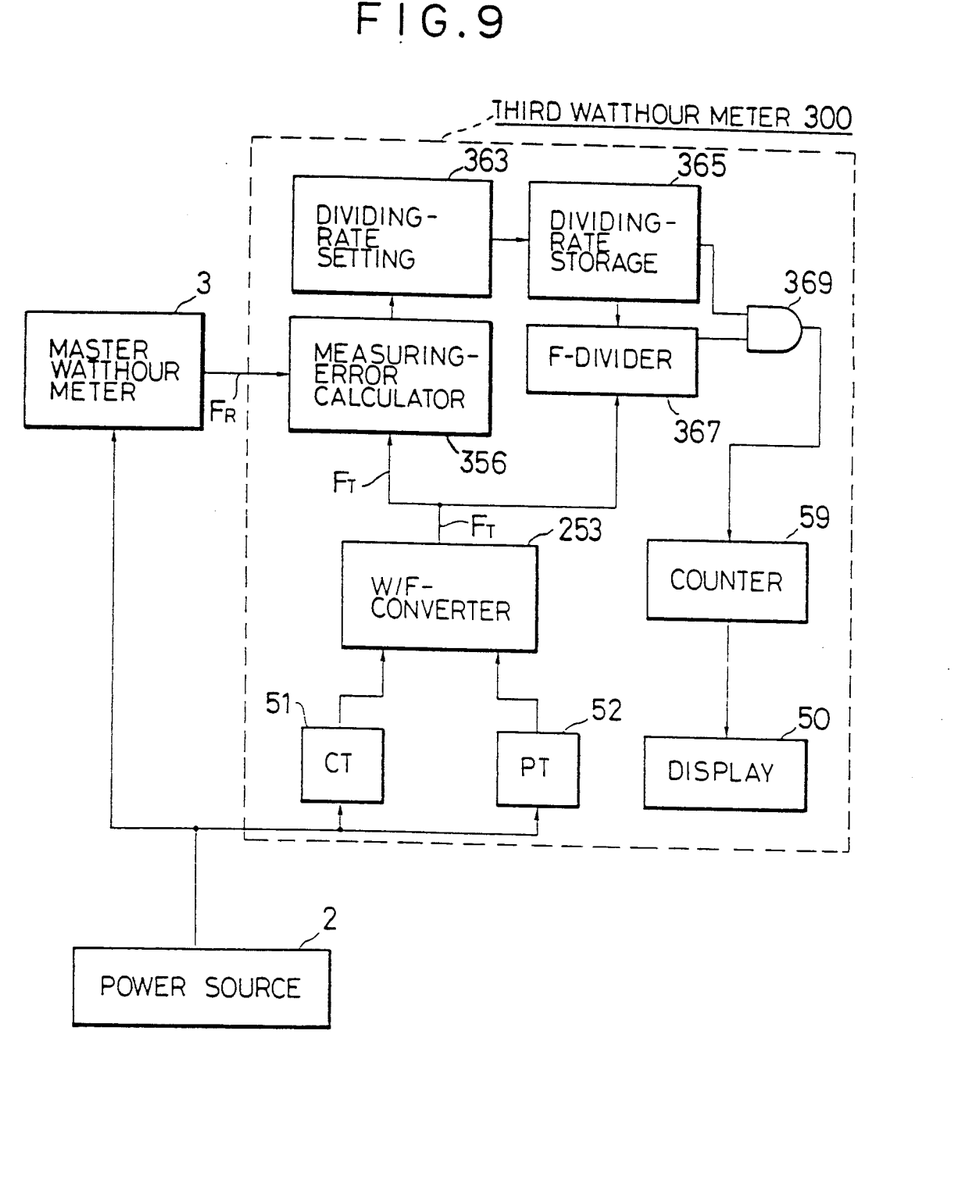
FIG. 9 is a schematic block diagram for representing an overall arrangement of an electronic type watthour measuring apparatus 300 according to a third preferred embodiment of the present invention; and, FIG. 10 is a schematic block diagram for indicating an internal circuit of the major arrangement employed in the third watthour meter 300 shown in FIG. 9.

FIG. 9 is represents an overall circuit arrangement of an electronic type watthour measuring apparatus 300 according to a third preferred embodiment of the present invention, which has been similarly accomplished based on the second basic idea of the present invention.

As apparent from FIG. 9, the major circuit of this third watthour meter 300 is similar to that of the second watthour meter 200 shown in FIG. 7, and therefore a further explanation thereof is omitted.

In the featured circuit arrangement of the third watthour meter 300 shown in FIG. 9, a dividing rate of a frequency divider 367 is controlled so as to perform a measuring-error correction. More specifically, an error in the frequency component of the voltage signal "$F_T$", which has been calculated by the measuring-error calculating unit 356 is supplied to a dividing-rate setting unit 363. Then, this dividing-rate setting unit 363 may set such a dividing rate that the above-described error may be canceled based on the calculated error value from the measuring-error calculating unit 356. This dividing rate is temporarily stored in a dividing-rate storage unit 365. Thereafter, the dividing rate stored in the dividing-rate storage unit 365 is supplied not only to the frequency divider 367, but also one input of an AND gate 369. In the frequency divider 367, the dividing rate supplied from the dividing-rate storage unit 365 is used to perform multiplication with the power-measured (frequency) pulse signal "$F_T$", so that the power-measured frequency signal "$F_T$" is corrected in accordance with this dividing rate. Thus, the corrected (frequency) pulse signal is supplied to the other input of this AND gate 369. Finally, the pulse signals divided by the corrected dividing rate are counted in the counter unit 59, whereby the corrected watthour data obtained from the third watthour meter 300 can be displayed on the display unit 50.

Similarly, the dividing-rate storage unit 365 may be formed by a non-volatile memory element, e.g., EEPROM. It should also be noted that the AND gate 369 AND-gates the output signals from the frequency divider 367 when the dividing rate is stored in the dividing-rate storage unit 365, and prohibits the output signal from the frequency divider 367 when no dividing rate is stored therein. More specifically, until the proper dividing rate is stored in the dividing-rate setting unit 63, a predetermined dividing rate, for instance, 1/1 has been stored in the dividing-rate storage unit 365. As a consequence, no error correction is carried out, and since the AND gate 369 is closed, no output signal from the frequency divider 367 is furnished to the counter unit 59.

INTERNAL CIRCUIT ARRANGEMENT OF MAJOR ARRANGEMENT IN THIRD WATTHOUR METER

Figure 10:
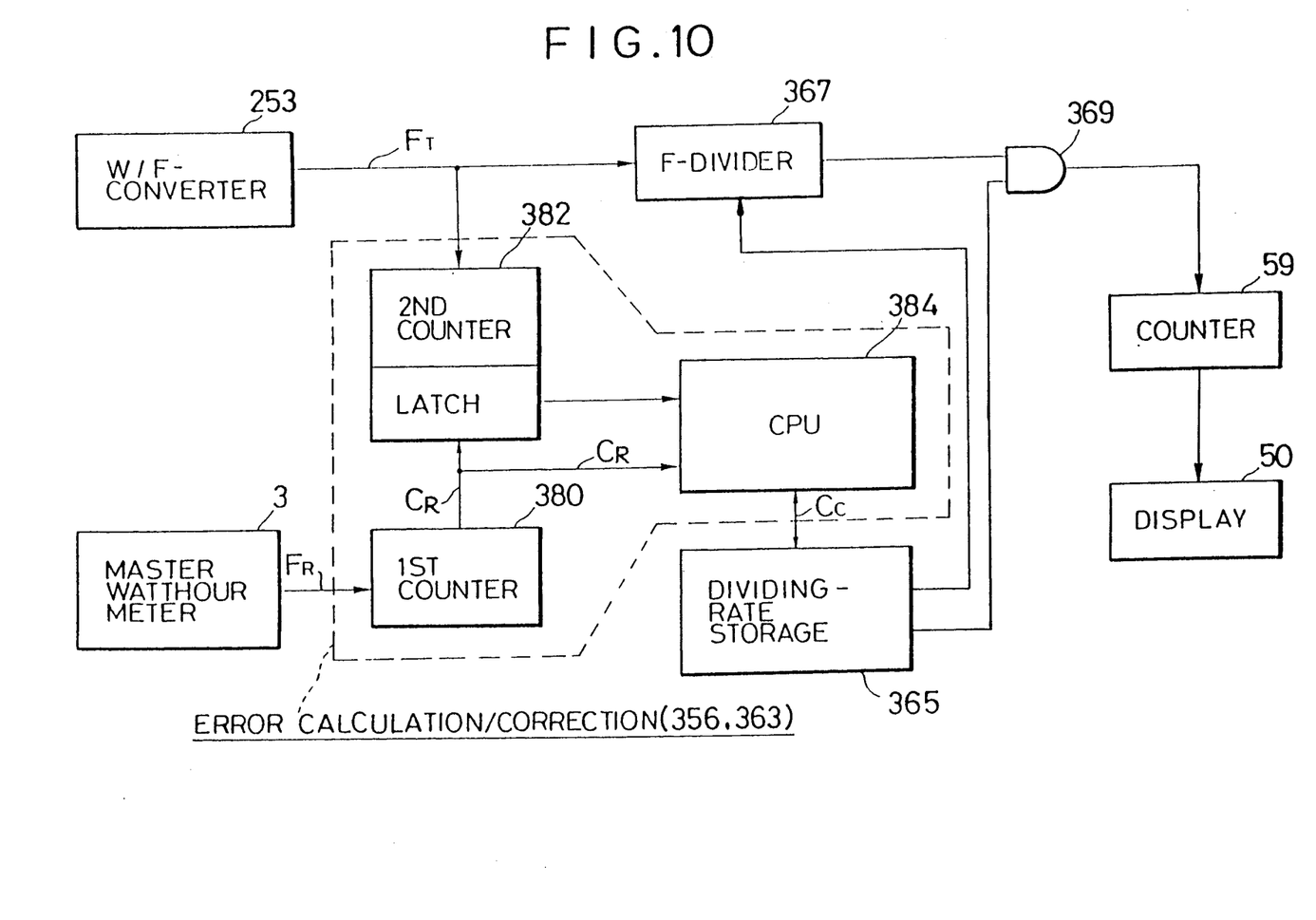

In FIG. 10, there is shown an internal circuit arrangement of the major (featured) arrangement employed in the third electronic type watthour measuring apparatus 300 shown in FIG. 9.

As apparent from FIG. 10, this internal circuit arrangement of the third watthour meter 300 is very similar to that of the second watthour meter 200 shown in FIG. 8.

In this internal circuit arrangement, the reference power pulse signal "$F_R$" containing the reference frequency component is counted by a first counter 380 employed in the measuring-error calculating unit 356. When the count value of this first counter 380 reaches a preselected count value and then delivers a carry signal "$C_R$" to both a second counter 382 with a latch function and also a central processing unit 384. Note that the first counter 380 is of a presettable counter, into which a predetermined count value can be preset.

On the other hand, the above-described power measuring pulse signal "$F_T$" is supplied from the W/F-converter 253 to the second counter 283 with the latch function, and another count value counted by the second counter 382 is latched in response to the carry signal "$C_R$" derived from the first counter 380.

Then, this count value latched in the second counter 382 is fetched into CPU 384 in response to the carry signal "$C_C$" as a trigger signal. A measuring-error calculation as defined above will now be executed under control of CPU 384. A measuring-error is calculated by CPU 384 based on the count data fetched in the second counter 382. Thereafter, such a dividing rate that can cancel this measuring error is calculated by processing the calculated measuring-error under control of CPU 384. The resultant dividing rate is stored in the dividing-rate storage unit 365.

Subsequently, the power-measuring frequency signal "$F_T$" derived from the W/F converter 253 is now frequency-divided based on the last-mentioned dividing rate read out from the dividing-rate storage unit 365, whereby the error-corrected power value can be displayed in the display unit 50. In other words, the measuring error can be automatically corrected by properly selecting the dividing rate of the frequency divider 367.

What is claimed is:

1. An electronic watthour measuring apparatus comprising:
    power-to-frequency (W/F) converting means for converting electrical power supplied from a power source into a first frequency signal having a first frequency and a measuring error, corresponding to the electrical power;
    frequency dividing means for dividing the first frequency of the first frequency signal in accordance with a controlled dividing rate to obtain a second frequency signal having a second frequency lower than the first frequency of the first frequency signal;
    means for calculating a difference between the first frequency of the first frequency signal and a reference frequency contained in a reference signal derived from a reference watthour meter while measuring the same electrical power from the power source; and
    means for setting said controlled dividing rate and applying said controlled dividing rate to the frequency dividing means in accordance with the difference between the first frequency and the reference frequency, whereby frequency-dividing operation by the frequency dividing means is controlled based on the dividing rate set by the setting means so as to eliminate the measuring error contained in the electrical power measured by the electronic type watthour measuring apparatus.

2. An electronic watthour measuring apparatus as claimed in claim 1, further comprising:
    storage means for storing therein said dividing rate set by the setting means.

3. An electronic watthour measuring apparatus as claimed in claim 2, wherein said storage means is constructed of a non-volatile memory device.

4. An electronic watthour measuring apparatus as claimed in claim 3, wherein said non-volatile memory device is selected from one of EPROM (Erasable Programmable Read-Only Memory) and EEPROM (Electrically-Erasable Programmable Read-Only Memory).

5. An electrical watthour measuring apparatus as claimed in claim 1, wherein both of said difference calculating means and said setting means include:
    a first counter for counting up a reference pulse indicative of said reference signal derived from the reference watthour meter and for producing a carry signal when a first count value thereof reaches a predetermined count value;
    a second counter with a latch function, for counting a power-measuring pulse signal indicative of the first frequency signal derived from the W/F-converting means, and for latching a second count value thereof in response to said carry signal; and
    a central processing unit for calculating said difference between the first frequency and the reference frequency, and also for calculating said correction coefficient based on the difference; and
    said measuring apparatus further comprising an AND gate for AND-gating said second frequency signal derived from said frequency dividing means, and said dividing rate set by said setting means, whereby only the second frequency signal from which the measuring error has been eliminated is outputted from the AND gate.

* * * * *